(12) United States Patent
Poppi et al.

(10) Patent No.: US 10,032,596 B2
(45) Date of Patent: Jul. 24, 2018

(54) METHOD FOR ASSEMBLING AN ELECTRON EXIT WINDOW AND AN ELECTRON EXIT WINDOW ASSEMBLY

(71) Applicant: TETRA LAVAL HOLDINGS & FINANCE S.A., Pully (CH)

(72) Inventors: Luca Poppi, Formigine (IT); Paolo Benedetti, Modena (IT)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 0 days.

(21) Appl. No.: 14/849,373

(22) Filed: Sep. 9, 2015

(65) Prior Publication Data

US 2015/0380197 A1    Dec. 31, 2015

Related U.S. Application Data

(62) Division of application No. 13/255,303, filed as application No. PCT/SE2010/001376 on Mar. 5, 2010.

(Continued)

(30) Foreign Application Priority Data

Mar. 11, 2009 (SE) .................................. 0900317

(51) Int. Cl.
*B23K 20/02* (2006.01)
*H01J 9/26* (2006.01)
(Continued)

(52) U.S. Cl.
CPC .............. *H01J 9/263* (2013.01); *B23K 20/02* (2013.01); *H01J 5/18* (2013.01); *H01J 9/24* (2013.01);
(Continued)

(58) Field of Classification Search
CPC .................. B23K 20/02; H01J 2237/04; H01J 2237/164; H01J 2237/166; H01J 33/04;
(Continued)

(56) References Cited

U.S. PATENT DOCUMENTS 1,907,507 A     5/1933   Coolidge
3,211,937 A  * 10/1965   Hester ........................ H01J 5/18
                                                           29/527.4
(Continued)

FOREIGN PATENT DOCUMENTS

DE           30 22 127 A1     1/1982
DE           195 18 623       11/1996
(Continued)

OTHER PUBLICATIONS

International Search Report (PCT/ISA/210) dated Jun. 25, 2010, by European Patent Office as the International Searching Authority for International Application No. PCT/SE2010/001376.

(Continued)

*Primary Examiner* — Erin B Saad
*Assistant Examiner* — Carlos J Gamino
(74) *Attorney, Agent, or Firm* — Buchanan Ingersoll & Rooney PC

(57) ABSTRACT

A method for assembling an electron exit window of an electron beam generating device comprises arranging a foil support plate on a housing of the electron beam generating device, bonding a window foil to a frame along at least one continuous bonding line, thus creating an exit window sub-assembly, and attaching the exit window sub-assembly onto the housing.

11 Claims, 3 Drawing Sheets

Related U.S. Application Data

(60) Provisional application No. 61/160,122, filed on Mar. 13, 2009.

(51) Int. Cl.
    *H01J 5/18* (2006.01)
    *H01J 9/24* (2006.01)
    *H01J 33/04* (2006.01)
    *H01J 37/16* (2006.01)

(52) U.S. Cl.
    CPC ............. *H01J 33/04* (2013.01); *H01J 37/16* (2013.01); *H01J 2237/04* (2013.01); *H01J 2237/164* (2013.01); *H01J 2237/166* (2013.01); *Y10T 156/10* (2015.01); *Y10T 428/13* (2015.01)

(58) Field of Classification Search
    CPC ...... H01J 37/16; H01J 5/18; H01J 9/24; H01J 9/263; Y10T 156/10; Y10T 428/13
    See application file for complete search history.

(56) References Cited

U.S. PATENT DOCUMENTS

| | | | | |
|---|---|---|---|---|
| 4,045,699 A | * | 8/1977 | Gunther | H01J 9/263 313/529 |
| 4,112,307 A | | 9/1978 | Föll et al. | |
| 4,153,854 A | * | 5/1979 | Christgau | H01J 29/86 228/208 |
| 4,238,043 A | * | 12/1980 | Minami | H01J 9/263 220/2.1 R |
| 4,333,036 A | | 6/1982 | Farrell | |
| 4,433,230 A | * | 2/1984 | Sano | B01J 3/006 219/118 |
| 4,461,972 A | | 7/1984 | Dmitriev et al. | |
| 4,588,894 A | * | 5/1986 | Yasuzuka | H01J 5/18 219/118 |
| 4,591,756 A | | 5/1986 | Avnery | |
| 4,717,860 A | * | 1/1988 | Christgau | H01J 5/26 228/124.1 |
| 5,159,621 A | * | 10/1992 | Watanabe | G21K 5/04 378/161 |
| 5,161,179 A | * | 11/1992 | Suzuki | G21K 1/10 228/194 |
| 5,210,426 A | * | 5/1993 | Itoh | H01J 33/04 219/121.21 |
| 5,506,403 A | * | 4/1996 | Yamada | H01J 9/24 250/207 |
| 5,751,784 A | * | 5/1998 | Enck | H01J 35/30 378/119 |
| 5,848,124 A | * | 12/1998 | Inazuru | B23K 1/0008 313/420 |
| 6,320,181 B1 | * | 11/2001 | Noji | H01J 9/26 228/110.1 |
| 6,320,303 B1 | * | 11/2001 | Noji | H01J 29/385 250/214 VT |
| 6,487,272 B1 | * | 11/2002 | Kutsuzawa | H01J 35/08 378/129 |
| 2004/0222733 A1 | | 11/2004 | Avnery et al. | |
| 2009/0160309 A1 | | 6/2009 | Burth et al. | |
| 2009/0212681 A1 | * | 8/2009 | Matsumura | H01J 33/04 313/420 |
| 2012/0087842 A1 | | 4/2012 | Kristiansson et al. | |
| 2014/0126702 A1 | * | 5/2014 | Haag | H01J 35/06 378/140 |
| 2015/0162163 A1 | * | 6/2015 | Anno | H01J 35/06 378/123 |
| 2017/0263412 A1 | * | 9/2017 | Maeda | H01J 35/18 |

FOREIGN PATENT DOCUMENTS

| | | | |
|---|---|---|---|
| EP | 0 059 249 | 1/1985 | |
| EP | 1 775 752 | 4/2007 | |
| GB | 2 166 284 | 4/1986 | |
| GB | 2166284 A | * 4/1986 | ............. H01J 33/04 |
| JP | S52-99763 A | 8/1977 | |
| JP | S61-38500 A | 2/1986 | |
| JP | 2001-013300 A | 1/2001 | |
| JP | 2008-079891 A | 4/2008 | |
| JP | 2008-128977 A | 6/2008 | |
| WO | WO 2007/105390 A1 | 9/2007 | |
| WO | WO 2008/062666 A1 | 5/2008 | |

OTHER PUBLICATIONS

International-Type Search Report dated Aug. 31, 2009, issued in the corresponding National Application No. 0900317-9.

* cited by examiner

-- PRIOR ART --

US 10,032,596 B2

METHOD FOR ASSEMBLING AN ELECTRON EXIT WINDOW AND AN ELECTRON EXIT WINDOW ASSEMBLY

This application is a divisional of U.S. application Ser. No. 13/255,303 filed on Sep. 8, 2011, which is a U.S. national stage application based on International Application No. PCT/SE2010/001376 filed on Mar. 5, 2010, which claims priority to U.S. Provisional Application No. 61/160,122 filed on Mar. 13, 2009 and Swedish Application No. 0900317-9 filed on Mar. 11, 2009, the entire content of all four of which is incorporated herein by reference.

THE FIELD OF THE INVENTION

The present invention refers to a method for assembling an electron exit window and an electron exit window assembly.

PRIOR ART

Electron beam generating devices may be used in sterilization of items, such as for example in sterilization of food packages or medical equipment, or they may be used in curing of e.g. ink. Generally, these devices comprise an electron exit window formed by a foil and a foil support plate. The foil support plate, which is preferably made of copper, has a plurality of apertures through which the electrons will exit from the electron beam generating device during operation. The foil may have a thickness of around 6-10 µm and may be made of titanium. Due to the thinness most of the electrons are able to pass through it.

The present invention primarily relates to electron beam generating devices used for irradiation of webs of material, i.e., electron beam generating devices having relatively large electron exit windows.

The method or process being used today for producing electron beam devices of the above type will be described in the following, referring to FIG. 1 and FIG. 2.

The electron beam device 100 comprises two parts; a tube body 102 housing and protecting the assembly 103 generating and shaping the electron beam, and a flange 104 carrying components relating to the output of the electron beam, such as the window foil 106 and the foil support plate 108 preventing the window foil 106 from collapsing as vacuum is established inside the device 100. Further, during operation of the electron beam device the foil 106 is subject to excessive heat. Thereby, the foil support plate 108 also serves the important purpose of conducting heat generated in the foil 106 during use away from the foil of the device. By keeping the foil temperature moderate a sufficiently long lifetime of the foil 106 may be obtained.

In the production the foil support plate 108, being of copper, is bonded to the flange 104, which is separate from the tube body 102 at this stage. The flange 104 is generally made of stainless steel. The window foil 106 is then bonded onto the foil support plate 108 along a line extending along the perimeter of the foil support plate 108, and excess window foil 106 is trimmed off. The foil 106 may subsequently be coated, in order to improve its properties regarding for instance heat transfer. The coating is made on the side of the foil 106 facing the outside of the electron beam generating device 100. The flange 104 is subsequently attached to the tube body 102 to form a sealed housing.

SUMMARY

The inventors of the present invention have discovered that this prior solution is not optimal when the electron beam device is used in for example oxygen containing atmospheres. Under these circumstances the accelerated electrons will generate ozone, which is a highly corrosive substance. The ozone may corrode the copper foil support, which may in turn compromise the seal of the housing and the function of the electron beam generating device. In addition, in a packaging machine producing food packages, hydrogen peroxide is often used to sterilize the machine parts before production of packages starts. Thus, the copper foil support may come into contact with hydrogen peroxide as well. Hydrogen peroxide is also highly corrosive for the copper foil support.

The most sensitive location is the copper volume at the bonding line with the foil 106. Here, the corrosion only needs to work underneath the bonding line, which is only a few tenths of a millimeter, in order to result in the unfortunate result described above.

The present invention aims at solving this problem by providing a method for assembling an electron exit window of an electron beam generating device, comprising the steps of: arranging a foil support plate on a housing of the electron beam generating device, bonding a window foil to a frame along at least one continuous bonding line, thus creating an exit window sub-assembly, and attaching the exit window sub-assembly onto the housing.

There are several advantages with the inventive method, one being that the attachment of the foil to the corrosion-proof frame, which in turn is bonded into a flange of the housing, will provide a seal, which will protect the copper foil support plate from being subjected to corrosive substances, which may cause corrosion and failing sealability.

A further advantage with this assembly method is that the foil may be coated on the inside, i.e. the side which will be facing the inside of the electron beam generating device. From a wear perspective it is an advantage to have the coating on the inside where it is protected from for example plasma. Further, if a coating is to be placed on the foil, only the sub-assembly comprising the foil and the frame need to be placed in the coating machine.

An additional advantage is related to component cost and the vulnerability of the foil. Assembling an electron beam device is a complex manufacturing method with several critical steps, one being for example the bonding of the foil to the frame and one being the optional coating of the foil. Further, the tube body and the flange are being costly components relative to the foil. By attaching the foil to a frame, and by attaching said frame to the rest of the electron beam generating device late in the manufacturing process, money may be saved if any of the steps related to the foil fails.

Preferred embodiments of the method are defined by the dependent claims.

The invention also comprises an electron exit window assembly of an electron beam generating device comprising a foil support plate and a window foil, wherein said foil support plate is arranged on a housing of the electron beam generating device, said window foil is bonded to a frame along at least one continuous bonding line, forming an exit window sub-assembly, and said exit window sub-assembly is attached to the housing.

The advantages discussed in relation to the method similarly apply also for the electron exit window assembly.

Preferred embodiments of the electron exit window assembly are defined by the dependent claims.

BRIEF DESCRIPTION OF THE DRAWINGS

In the following, an exemplary embodiment of the invention will be described in greater detail, with reference to the enclosed drawings, in which.

DESCRIPTION OF PREFERRED EMBODIMENTS

Figure 1:
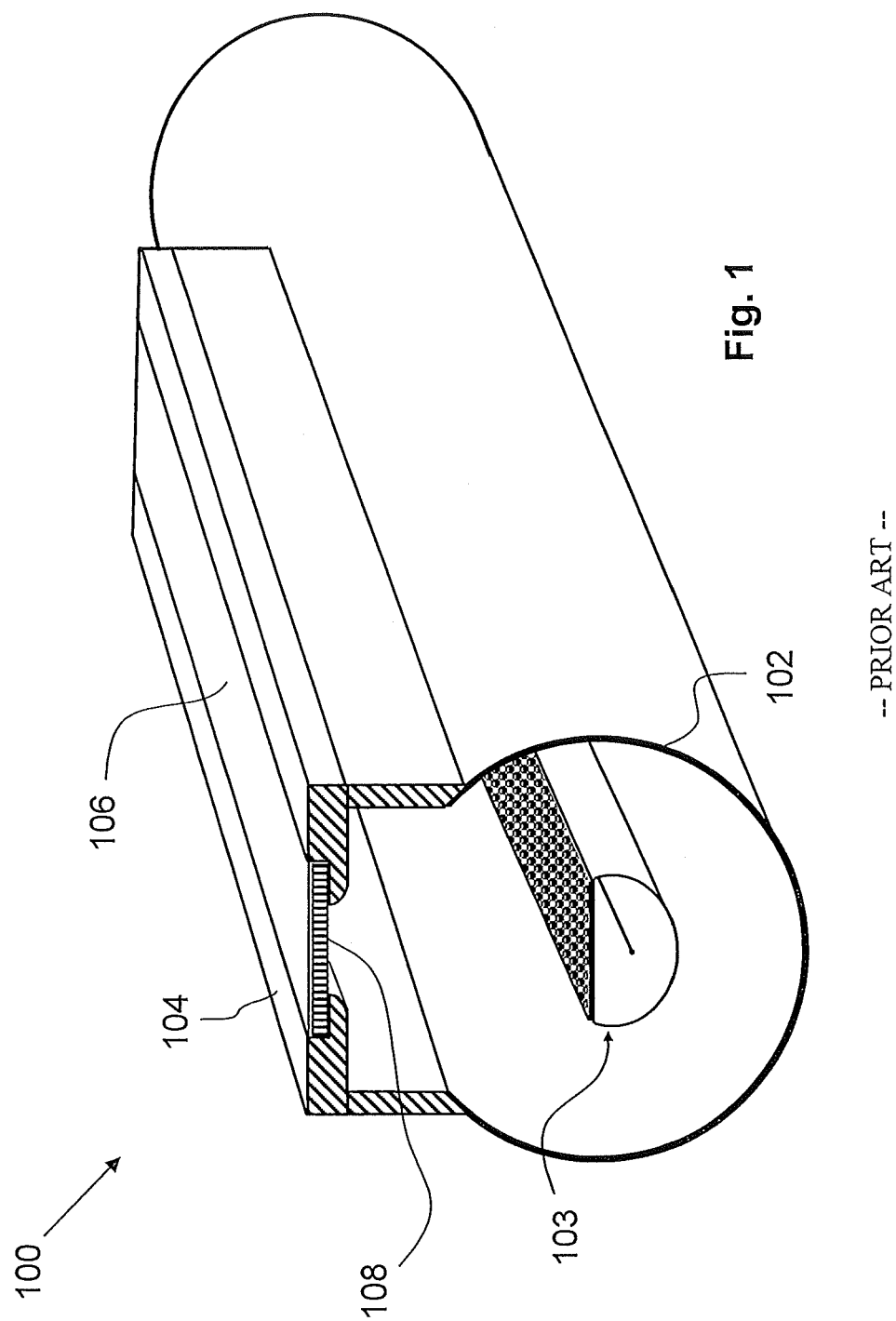
FIG. 1 is a schematic cross sectional isometric view of an electron beam device according to prior art.
Figure 2:
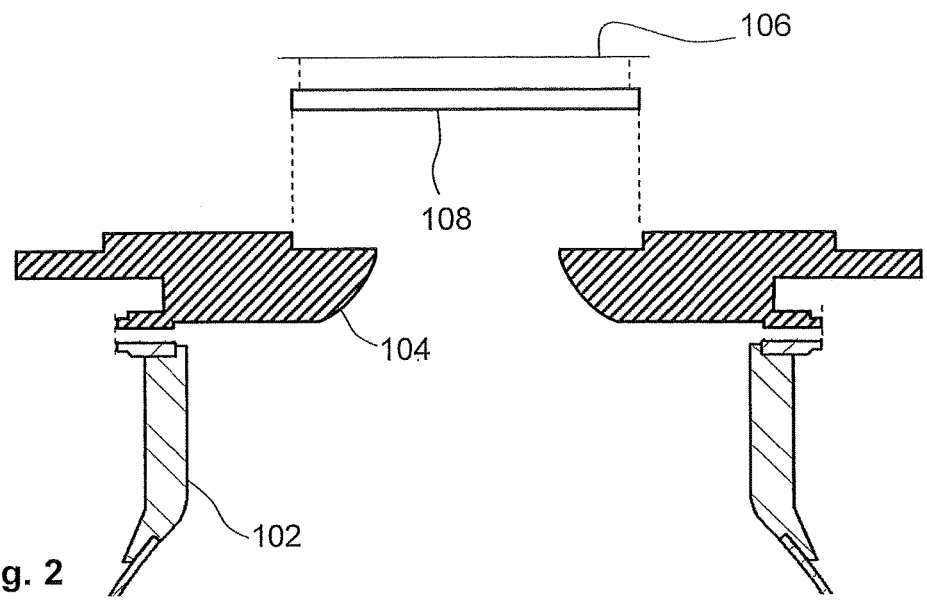
FIG. 2 is a schematic partial cross section of the device of FIG. 1, shown as an exploded view.
Figure 3:
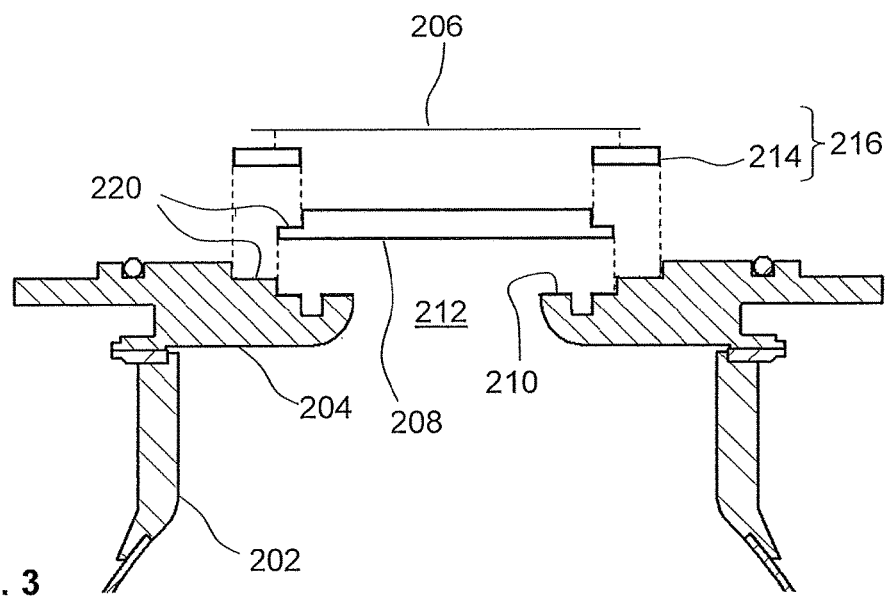
FIG. 3 is a schematic partial cross section of a device according to a first embodiment of the invention, for comparison with the cross section of FIG. 2, as shown as an exploded view.
Figure 4:
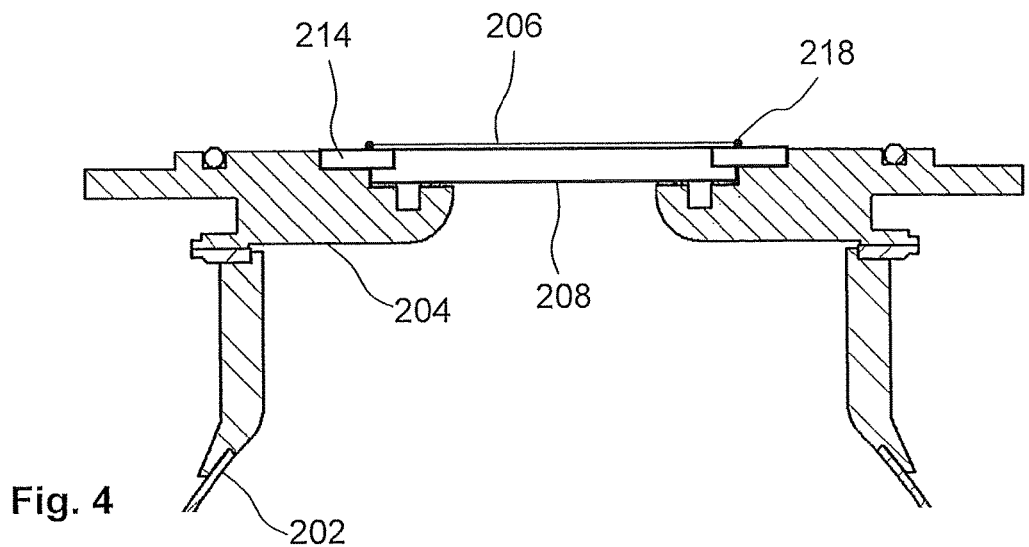
FIG. 4 is a schematic partial cross section similar to FIG. 3, but shown in an assembled state.

FIGS. 1 and 2, comprising a prior art solution, have already been described. In an exemplary embodiment of the present invention, as shown in FIGS. 3 and 4, a foil support plate 208 is arranged on the housing of an electron beam generating device. The foil support plate 208 is preferably made of copper and is bonded to a flange 204 of the housing. One possible bonding technique is brazing. The foil support plate 208 is bonded to an edge 210 of an opening 212 in the flange 204.

In a separate step, or in the same manufacturing step, said flange 204 is plasma welded to the tube body 202 forming said housing of the electron beam generating device. In another embodiment, not shown, the tube body 202 and the flange 204 is made in one piece.

In a separate step the window foil 206 is bonded onto a frame 214 to form an exit window sub-assembly 216. The word "frame" should here be interpreted as an element having a central hole configuration. The foil 206 is preferably made of titanium and said frame 214 is preferably made of stainless steel. Possible bonding techniques may be for example laser welding, electron beam welding, brazing, ultrasonic welding, diffusion bonding and gluing. In the exemplary embodiment the foil 206 is diffusion bonded onto the frame 214 along a continuous bonding line 218 partly shown in FIG. 4. The bonding line 218 is continuous to be able to maintain vacuum inside the electron beam device. The word "continuous" is used to define that the line is endless or closed. Further, it should be defined that the bonding line 218 extends along the hole configuration of the frame 214 but within the perimeter of the frame 214. Preferably, the bonding line 218 extends at a distance from the perimeter of the frame 214. Furthermore, at least one bonding line 218 is made. Thus, two or more bonding lines may be made. For example, an inner and an outer bonding line may be made on the frame 214, and the two lines may, for instance, be concentric with each other.

At this stage the foil 206 may optionally be coated and in the coating process only the exit window assembly 216 needs to be processed. According to this embodiment the foil 206 may be coated on both sides, but preferably on the inside, i.e. the side of the foil 206 which will face the inside of the electron beam generating device once assembled.

Figure 5:
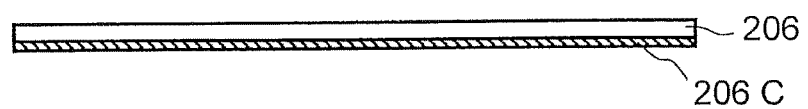
FIG. 5 is a partial cross section of a foil provided with a coating according to an embodiment of the present invention.

In FIG. 5 the foil 206 is shown with a coating denoted 206C.

The coating 206C serves the purpose of increasing thermal conductivity in order to increase the lifetime of the foil 206.

As mentioned an advantage with the present invention is the possibility of being able to provide the coating 206C to the inside of the foil 206. Plasma, which is being built up outside of the electron exit window during operation of the electron beam device, can wear down the coating of an electron exit window. However, on the inside of the foil 206 the coating 206C will be protected from the effects of plasma. Hence, there is an opportunity, with the present invention, to choose among several heat conductive coating materials, for example DLC (Diamond-like-carbon), copper, aluminium, graphite, silver and gold.

Subsequently, the frame 214, and thereby the exit window sub-assembly 216 may be attached to the flange 204 portion of the housing.

The step of attaching the exit window sub-assembly 216 to the housing is made in such a way that it forms a protection for the foil support plate 208 ensuring that the foil support plate 208 is not exposed to the environment outside of the electron beam generating device. As may be seen from FIG. 3 and FIG. 4 the frame 214 is arranged in an indentation 220 partly formed by the flange 204 of the housing and partly formed by the foil support plate 208. In an alternative embodiment, not shown, the indentation for receiving the frame may be formed in the housing only.

The frame 214 of the exit window sub-assembly 216 is preferably welded onto the housing.

It can be seen from FIG. 4 that after attachment of the exit window sub-assembly 216 onto the housing no portion of the foil support plate 208 is exposed to the outside atmosphere, and thereby corrosion of the copper foil support plate 208 is prevented.

Further to the advantages, the exit window sub-assembly 216 may be tested separately, such that the hermetic sealing in the bond, along bonding line 218, between the foil 206 and the frame 214 is confirmed before the exit window sub-assembly 216 is welded to the flange 204. Should the seal be defective the exit window sub-assembly 216 may simply be discarded without affecting the cost or production time to any great extent. The frame 214 has in this exemplary embodiment a thickness of 3 mm, and is made of stainless steel.

With the inventive solution there is an additional advantage in that the window foil 206 will be exposed to few processing steps. It should be understood that, with regard to the thinness of the foil 206, any processing work on or near the foil 206 may jeopardize the integrity of the foil 206.

The invention claimed is:

1. A method for assembling an electron exit window of an electron beam generating device, comprising:
    arranging a foil support plate on a housing of the electron beam generating device, the foil support plate comprising an indentation and the housing comprising an indentation;
    bonding a metal window foil to a frame along at least one continuous bonding line, thus creating an exit window sub-assembly; and
    attaching the exit window sub-assembly onto the housing by positioning the frame of the exit window sub-assembly in both the indentation of the foil support plate and the indentation of the housing.

2. The method according to claim 1, comprising attaching said exit window sub-assembly to the housing in such a way that it forms a protection for the foil support plate ensuring that the foil support plate is not exposed to an environment outside of the electron beam generating device.

3. The method according to claim 1, comprising diffusion bonding said window foil to the frame.

4. The method according to claim 1, comprising providing the window foil with a coating before attaching the exit window sub-assembly onto the housing.

5. The method according to claim 4, comprising providing said coating on a side of the window foil which will face an inside of the electron beam generating device once assembled.

6. The method according to claim 1, wherein attaching of the exit window sub-assembly comprises welding of the frame onto the housing.

7. A method for assembling an electron exit window of an electron beam generating device, comprising:
bonding a window foil made of metal to a frame along at least one endless bonding line to create an exit window sub-assembly in which the window foil is bonded to the frame, the frame surrounding an open region and the window foil extending across the entire open region;
securing a foil support plate to an edge of an opening in a flange of a housing of the electron beam generating device so that the foil plate spans the entire opening, the foil support plate comprising an indentation and the flange of the housing comprising an indentation that directly communicates with the indentation of the foil support plate so that the indentation of the foil support plate and the indentation of the flange form a continuous indentation; and
attaching the exit window sub-assembly onto the housing in covering relation to the foil support plate so that no part of the foil support plate is exposed to outside atmosphere by arranging the frame of the exit window sub-assembly in the continuous indentation collectively formed by the foil support plate and the flange of the housing.

8. The method according to claim 7, wherein the window foil is bonded to the frame either before or after the securing of the foil support plate to the edge of the opening in the flange.

9. The method according to claim 7, wherein the bonding of the window foil to the frame comprises diffusion bonding the window foil to the frame.

10. The method according to claim 7, wherein the window foil comprises a coating thus being a coated window foil, the bonding of the window foil to the frame comprising bonding the coated window foil to the frame.

11. A method for assembling an electron exit window of an electron beam generating device, comprising:
arranging a foil support plate on a housing of the electron beam generating device, the foil support plate and the housing each comprising an indentation,
bonding a window foil made of metal to a frame along at least one continuous bonding line to create an exit window sub-assembly, and
attaching the exit window sub-assembly onto the housing, the attaching of the exit window sub-assembly comprising positioning the frame of the exit window sub-assembly in the indentation of the foil support plate and in the indentation of the housing.

* * * * *